United States Patent
Ono et al.

(10) Patent No.: US 7,018,785 B2
(45) Date of Patent: Mar. 28, 2006

(54) METHOD FOR FORMING PATTERN AND TREATING AGENT FOR USE THEREIN

(75) Inventors: Kazuyo Ono, Tokyo (JP); Yusuke Takano, Kakegawa (JP); Hatsuyuki Tanaka, Kakegawa (JP); Satoru Funato, Tokyo (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 219 days.

(21) Appl. No.: 10/416,412

(22) PCT Filed: Oct. 24, 2001

(86) PCT No.: PCT/JP01/09320

§ 371 (c)(1),
(2), (4) Date: May 8, 2003

(87) PCT Pub. No.: WO02/41081

PCT Pub. Date: May 23, 2002

(65) Prior Publication Data

US 2004/0053170 A1    Mar. 18, 2004

(30) Foreign Application Priority Data

Nov. 15, 2000 (JP) .............................. 2000-347661

(51) Int. Cl.
*G03F 7/00* (2006.01)
(52) U.S. Cl. ........................ 430/327; 430/322; 430/330
(58) Field of Classification Search ................ 430/322, 430/327, 330
See application file for complete search history.

(56) References Cited

U.S. PATENT DOCUMENTS

| | | | |
|---|---|---|---|
| 5,541,037 A | 7/1996 | Hatakeyama et al. | 430/273.1 |
| 5,648,199 A | 7/1997 | Kishimura | 430/311 |
| 6,132,939 A | 10/2000 | Ina | 430/325 |
| 6,309,789 B1 * | 10/2001 | Takano et al. | 430/270.1 |
| 6,465,161 B1 * | 10/2002 | Kang et al. | 430/327 |

FOREIGN PATENT DOCUMENTS

| | | |
|---|---|---|
| EP | 0 522 990 A1 | 1/1993 |
| EP | 0 522 990 B1 | 1/1993 |
| EP | 0 522 990 B1 | 9/1996 |
| JP | 5-040346 | 2/1993 |
| JP | 5-341536 | 12/1993 |
| JP | 6-242605 | 9/1994 |
| JP | 6-242606 | 9/1994 |
| JP | 6-267838 | 9/1994 |
| JP | 7-295228 | 11/1995 |
| JP | 9-080753 | 3/1997 |

OTHER PUBLICATIONS

Hiroshi Ito et al, "Approach Toward Environmental Stabilization of Chemical Amplification Resists", Journal of Photopolymer Science and Technology, vol. 6, No. 4 (1993) pp. 547-562.
Hiroshi Ito et al, "Chemical Amplification in the Design of Dry Developing Resist Materials", Polymer Engineering and Science, Dec., 1983, vol. 23 No. 18, pp. 1012-1018.

* cited by examiner

*Primary Examiner*—Nicole Barreca
(74) *Attorney, Agent, or Firm*—Sangya Jain; Alan P. Kass

(57) ABSTRACT

A method of forming resist patterns comprises the steps of (a) applying and forming a chemically amplified photoresist film, (b) applying a treating agent with a pH value of 1.3 to 4.5 onto said chemically amplified photoresist film, (c) baking said chemically amplified photoresist film after at least one of the steps of applying and forming said chemically amplified photoresist film and applying said treating agent, (d) selectively exposing said chemically amplified photoresist film, (e) post exposure-baking said chemically amplified photoresist film, and (f) developing said chemically amplified photoresist film, wherein the contact angle of a non-exposed portion of said chemically amplified photoresist film to a developing solution after wash with water to remove the treating agent on the photoresist and spin-drying before development is made lower by 10° to 110° than that in the case where said treating agent is not applied. In this method, the wetting property of the developing solution to the photoresist film are improved and the influence of floating basic species are reduced by the action of an acid component such as organic acid contained in the treating agent to form resist patterns with good shape.

8 Claims, No Drawings

METHOD FOR FORMING PATTERN AND TREATING AGENT FOR USE THEREIN

TECHNICAL FIELD

The present invention relates to a method of forming resist patterns having good shape by use of a chemically amplified photoresist and in particular to a method capable of forming resist patterns having good shape by reducing the influence of process environment, particularly of floating basic species, as well as a treating agent used in the method.

BACKGROUND ART

In manufacturing semiconductor elements, lithographic techniques have been employed in which a photoresist coating is formed on a substrate such as a silicon wafer, then selectively irradiated with actinic rays, and subjected to development processing to thereby form a resist pattern on the substrate.

In recent years, in order to attain much higher degree of integration in LSI, a patterning technique to form a pattern with a finer line width by a lithographic process has made a rapid progress. For forming a pattern with a finer line width, various proposals have been made with respect to all steps of the lithographic process and all materials to be used therein including photoresists, antireflective coatings, exposing methods, exposing apparatus, developing agents, developing processes and developing apparatus. For example, Japanese Patent No. 2,643,056 and Japanese Unexamined Patent Publication (JP-A) No. H7-181685 describe that a surface antireflective coating containing a fluorine-containing compound with a low refractive index is formed on a resist layer to thereby prevent detrimental influences of reflected light from the resist surface on formation of a resist pattern. To form an antireflective coating on a resist layer provides the advantage that, since degree of vibration amplitude of the thickness of a resist layer vs. sensitivity curve becomes smaller, the fluctuation in sensitivity of the resist layer becomes smaller even when the thickness of the resist layer fluctuates, which leads to a decreased fluctuation in dimension of resist patterns formed. In addition, the surface antireflective coating serves to decrease standing waves caused by interference between incident light and reflected light or between one reflected light and another reflected light. Recently, techniques of forming a resist pattern having a desired line width without providing the surface antireflective coating have also been developed. For example, an underlying substrate is made plane to depress fluctuation in dimension of a resist pattern due to fluctuation in thickness of the-resist layer as described above, or a mask pattern is finely adjusted beforehand according to fluctuation in dimension of the resist pattern.

With regard to exposing apparatus, there has been proposed a process of using a light source emitting radiation of a short wavelength, which is advantageous for forming a finer pattern, such as deep UV rays of KrF excimer laser (248 nm) or ArF excimer laser (193 nm) or, further, X rays or electron beams, and some of them have been coming into practice.

On the other hand, improvement in the yield of semiconductor integrated circuits has occupied the attention as an extremely important matter in manufacturing them. There exist many factors that deteriorates the yield of semiconductor integrated circuits. One of the factors is patterning failure upon forming a pattern using a resist. This patterning failure of a resist pattern is caused, for example, by dust existing in the resist or on the surface thereof, by deterioration of the resist due to basic species floating in a clean room, by coating failure of the resist, by development failure or the like. As an example of deterioration of resist due to chemical species floating in a clean room, there is illustrated deterioration of resist in a process using a chemically amplified photoresist. In this process, the chemically amplified photoresist is so susceptible to the influence of basic substances and moisture in the atmosphere that there results a change in dimension of a pattern—for example, a T-topped resist pattern results when a positive-working photoresist is used, or a round-topped resist pattern results when a negative-working photoresist is used—in case when the period between patternwise exposure and PEB (post exposure bake) is prolonged or due to intermixing with a resist.

To solve these problems described above, radiation sensitive resin compositions have been examined and their environmental resistance has been improved. From the viewpoint of the constitution of the radiation sensitive resin composition, there has been proposed improvement of the environmental resistance of the composition by incorporating basic sulfonium or basic ammonium compounds (JP-A H6-242605, JP-A H6-242605 and JP-A H6-242606), or by lowering the glass transition point of the resin thereby reducing the free volume of the resin, thus decreasing the amount of basic materials adsorbed into the radiation-sensitive resin composition (J. Photopoly. Sci. Tech. vol. 6, No. 4, pp. 547–562, 1993). In addition, there has been proposed further improvement of the environmental resistance of the composition by further specifying the resin (JP-A H9-80753). Further, use of organic materials such as polyethylene and an acidic polymer (JP-A H7-295228) or paraffin film (JP-A H11-95442) as a protective film on the radiation-sensitive resin composition has also been proposed. Even by these techniques, however, the problems described above are not completely solved under the present situation with regard to chemically amplified photoresists such as ones being sensitive to ArF laser light source having an exposure light wavelength of 193 nm.

Under these circumstances, an object of the present invention is to provide a method capable of forming resist patterns having good shape by reducing the influence of floating basic species on chemically amplified photoresists, as well as a treating agent used in the method.

DISCLOSURE OF THE INVENTION

As a result of eager study, the present inventors found that in a method of forming a resist pattern by exposing and developing a chemically amplified photoresist film formed on a substrate, when the chemically amplified photoresist film has been applied with an acidic treating agent, exposed, baked, washed with water to remove the treating agent and spin-dried before the development, the contact angle of a non-exposed portion of the chemically amplified photoresist film to a developing solution is made significantly lower than where the treating agent is not applied, whereby the wetting properties of the developing solution on the photoresist film are improved, and the influence of floating basic species is reduced by the acid component contained in the treating agent, thus achieving the object described above and arriving at the present invention.

That is, the present invention relates to a method of forming resist patterns which comprises the steps of (a) applying and forming a chemically amplified photoresist film, (b) applying a treating agent with a pH value of 1.3 to 4.5 onto said chemically amplified photoresist film, (c)

baking said chemically amplified photoresist film after at least one of the steps of applying and forming said chemically amplified photoresist film and applying said treating agent, (d) selectively exposing said chemically amplified photoresist film, (e) post exposure-baking said chemically amplified photoresist film, and (f) developing said chemically amplified photoresist film, wherein the contact angle of a non-exposed portion of said chemically amplified photoresist film to a developing solution after washing with water to remove the treating agent on the photoresist and spin-drying before development is made lower by 10° to 110° than that in the case where said treating agent is not applied.

DETAILED DESCRIPTION OF THE INVENTION

The present invention will be described more specifically below.

In the method of forming resist patterns according to the present invention, the treating agent and the process conditions are selected such that the contact angle, to a developing solution, of a non-exposed portion of chemically amplified photoresist film which is obtained after steps of applying a chemically amplified photoresist onto e.g. a substrate to form a photoresist film thereon, applying an acidic treating agent whose pH value is 1.3 to 4.5 onto this photoresist film, baking before or after the application of the acidic treating agent, exposing, post-exposure baking, wash with water to remove the treating agent on the photoresist film and spin-drying, is made lower by 10° to 110° than where the treating agent is not applied.

As the chemically amplified photoresist to be used in the present invention, a positive-working chemically amplified photoresist is preferred. As the positive-working chemically amplified photoresist, there are known a number of ones including, for example, that which comprises a polymer of polyhydroxystyrene protected with t-butoxycarbonyl group and a photo acid generator (see, H. Ito, and C. G. Willson: Polym. Eng. Sci., 23, 1012 (1983)). Thickness of the resist film may be such that a resist pattern obtained after development can suitably exert its performance during etching in the etching step, and is generally about 0.2 to 1.0 µm.

The pH value of the acidic treating agent to be used in the pattern forming method of the present invention is 1.3 to 4.5, preferably 1.7 to 3.5. In addition, the acid component in the treating agent is preferably an organic acid. As for the relation between a pH value of the treating agent and a contact angle of the non-exposed portion of the chemically amplified photoresist film to a developing solution after wash with water and spin-drying, the contact angle of the non-exposed portion of chemically amplified photoresist film becomes usually lower responding to the pH value of the treating agent becomes smaller. That is the amount of decrease in the contact angle of a non-exposed portion of the chemically amplified photoresist film to a developing solution becomes larger. When the reduced angle of the contact angle is less than 10°, there is no effect of the application with the treating agent and the pattern profile is bad. And when the reduced angle of the contact angle is over 110°, the pattern profile is deteriorated by too much reduction in thickness of the resist film during development.

The organic acid used preferably in the treating agent of the present invention is a fluorocarbon compound having acid group(s), and such organic acid may be in the form of e.g. an ammonium salt or organic amine salt thereof. Among fluorocarbon compounds having acid group(s) and salts thereof, $C_4$ to $C_{15}$ perfluoroalkylcarboxylic acids and the ammonium salts, tetramethylammonium salts or $C_1$ to $C_4$ alkanolamine salts thereof; $C_4$ to $C_{10}$ perfluoroalkylsulfonic acids and the ammonium salts, tetramethylammonium salts or $C_1$ to $C_4$ alkanolamine salts thereof; fluorinated alkyl quaternary ammonium iodides; and perfluoroadipic acid and the quaternary ammonium salts thereof are preferred, with tetramethylammonium salts of $C_7$ to $C_{10}$ perfluoroalkylcarboxylic acids, $C_4$ to $C_8$ perfluoroalkylsulfonic acids and the $C_1$ to $C_4$ alkanolamine salts thereof being more preferred. As the amine salts or ammonium salts of the organic acids, previously prepared salts may be used, or these salts may be formed at the time of production of the treating agent by adding an organic acid and a base such as an organic amine or ammonia or solutions thereof to the treating solution, or by mixing solutions thereof to form a base solution of the treating agent.

The organic acids and salts thereof show surface activity, and are used as the treating agent in the form of an aqueous solution thereof in a concentration of usually 0.1 to 25% by weight, preferably 2 to 4% by weight. In preparation of the treating agent, it is preferable that the ratio of the organic acid to the base such as organic amine and ammonia is suitably regulated, the basicity etc. of the treating agent are regulated in consideration of the chemically amplified photoresist and process conditions used, and the amount of decrease in contact angle to the developing solution at the non-exposed portion of the chemically amplified photoresist film is optimized, whereby the reduction in thickness of the film during development is optimized.

That is, in the case of using, for example, a positive-working photoresist as the chemically amplified photoresist, it suffices to adjust, upon using a salt between the organic acid and the organic amine or ammonium, the mixing ratio of the organic acid to the amine or ammonium so that the pH value of the treating agent becomes at an optimal pH value within the above-described range. And in this mixing, better results can often be obtained when the organic acid is used in an amount more than the equivalent amount of the base, than when the treating agent is wholly composed of the organic acid or the salt between the organic acid and the amine or ammonium. In the treating agent to be applied to a positive-working chemically amplified photoresist, the ratio of the organic acid to the base (for example, organic amine) is usually about 7:0 to 7:6 in molar ratio, preferably about 7:4 to 7:6, more preferably about 7:5. In terms of organic acid: salt, the molar ratio is usually about 7:0 to 1:6, preferably about 3:4 to 1:6, more preferably about 2:5.

In the treating agent of the present invention, a water-soluble polymer, perfluoroalkyl sulfonamide, and various additives may be added in the range of not failing the performance of the treating agent, if necessary.

As the water-soluble polymer to be used in the treating agent of the present invention, there may be illustrated, for example, poly(vinyl alcohol), poly(acrylic acid), poly(vinylpyrrolidone), poly(α-trifluoromethylacrylic acid), poly (vinyl methyl ether-co-maleic anhydride), poly(ethylene glycol-co-propylene glycol), poly(N-vinylpyrrolidone-co-vinyl acetate), poly(N-vinylpyrrolidone-co-vinyl alcohol), poly(N-vinylpyrrolidone-co-acrylic acid), poly(N-vinylpyrrolidone-co-methyl acrylate), poly(N-vinylpyrrolidone-co-methacrylic acid), poly(N-vinylpyrrolidone-co-methyl methacrylate), poly(N-vinylpyrrolidone-co-maleic acid), poly(N-vinylpyrrolidone-co-dimethyl maleate), poly(N-vinylpyrrolidone-co-maleic anhydride), poly(N-vinylpyrrolidone-co-itaconic acid), poly(N-vinylpyrrolidone-co-methyl itaconate), poly(N-vinylpyrrolidone-co-itaconic anhydride, and fluorinated polyether, with poly(acrylic acid), poly(vinylpyrrolidone) and fluorinated polyether being particularly preferred.

By adding the water-soluble polymer, an uniform coating film of the treating agent can be formed and the water-soluble polymer film formed serves as a physical barrier to prevent contact with basic species floating in an atmosphere, thus often giving rise to better results.

As the perfluoroalkyl sulfonamide, compounds represented by the general formula:

$$C_nF_{2n+1}SO_2NH_2 \qquad (II)$$

wherein n is 1 to 8, are preferred and more preferably n is 4 to 8. By adding the perfluoroalkyl sulfonamide, the wetting properties of the treating agent to the resist film are improved.

As the additives used for treating agent of the present invention, there may be illustrated, for example, surfactants to be added for improving coating properties, such as nonionic surfactants, anionic surfactants and amphoteric surfactants.

The nonionic surfactants are exemplified by polyoxyethylene alkyl ethers such as polyoxyethylene lauryl ether, polyoxyethylene oleyl ether and polyoxyethylene cetyl ether, polyoxyethylene fatty acid diesters, polyoxyethylene fatty acid monoester, polyoxyethylene-polyoxypropylene block polymer, and acetylene glycol derivatives. The anionic surfactants are exemplified by alkyldiphenyl ether disulfonic acids and the ammonium salts or organic amine salts thereof, alkyldiphenyl ether sulfonic acids and the ammonium salts or organic amine salts thereof, alkylbenzenesulfonic acids and the ammonium salts or organic amine salts thereof, polyoxyethylene alkyl ether sulfuric acids and the ammonium salts or organic amine salts thereof, and alkyl sulfuric acids and the ammonium salts or organic amine salts thereof. And the amphoteric surfactants are exemplified by 2-alkyl-N-carboxymethyl-N-hydroxyethyl-imidazolinium betaine and laurylamidopropyl hydroxysulfone betaine.

Further, as water to be used in the treating agent of the present invention, water from which organic impurities, metal ions, etc. have been removed by distillation, ion-exchange treatment, treatment through filter or various adsorption treatments are preferably used.

Additionally, in order to improve coating properties of the treating agent, a water-soluble organic solvent may be used together with water. The water-soluble organic solvent is not particularly limited as long as it can be soluble in water in a concentration of 0.1 wt % or more. Examples of the organic solvent include alcohols such as methyl alcohol, ethyl alcohol and isopropyl alcohol, ketones such as acetone and methyl ethyl ketone, esters such as methyl acetate and ethyl acetate, and polar solvents such as dimethylformamide, dimethylsulfoxide, methyl cellosolve, cellosolve, butyl cellosolve, cellosolve acetate, butylcarbitol and carbitol acetate. These specific examples are merely illustrated as examples of the organic solvents, and the organic solvents to be used in the present invention are not limited only to these solvents.

As the specifically preferable treating agent used in the resist pattern forming method of the present invention, there are illustrated a treating agent comprising at least the following (A), (B), (C), (D) and (E) and having a pH value of 1.3 to 4.5; (A) perfluoroalkylsulfonic acid represented by the general formula:

$$C_mF_{2m+1}SO_3H \qquad (I)$$

wherein m is an integer of 4 to 10,
(B) organic amine,
(C) water-soluble polymer,
(D) perfluoroalkyl sulfonamide represented by the general formula:

$$C_nF_{2n+1}SO_2NH_2 \qquad (II)$$

wherein n is an integer of 1 to 8, and (E) water.

These components are preferably compounded such that perfluoroalkyl sulfonic acid (A)/organic amine (B)/perfluoroalkyl sulfonamide (D) is (2.0 to 7.0)/(0.1 to 1.0)/(0.01 to 2.0) assuming that water-soluble polymer (C) is 1.

As described above, components (A) and (B) may be those that were mixed previously to form a salt thereof. That is, the aforementioned constitution includes the case that components (A) and (B) were mixed previously.

In the present invention, the optimization of the contact angle is effected by applying the acidic treating agent, but further optimization may also be effected as necessary by regulating baking temperature or by regulating the time of removal of the treating agent after post-exposure baking.

Thickness of the coating film of the treating agent in the present invention is preferably 80 to 10000 Å, more preferably 330 to 990 Å. The application of the treating agent can be conducted by any of known coating methods such as a spin coating method.

The pattern-forming method of the present invention can favorably be applied upon formation of a pattern on a substrate such as a silicon wafer having a diameter of 8 inches. As the substrate, a silicon substrate is common, but the substrate may of course be silicon on which a metal layer or a oxide or nitride layer such as silicon oxide, silicon nitride or silicon oxide nitride is formed. In addition, the substrate material itself is not limited to silicon. It may be any of materials having so far been used for manufacturing IC such as LSI. In addition, the pattern-forming method of the present invention can also be applied to treatment of a substrate having an inter-level dielectric of polysilazane, $SiO_2$, polyimide etc.

Further, the application method of the chemically amplified photoresist, the baking method of the chemically amplified photoresist film and the film of the composition for reducing the contact angle of the photoresist film, the exposure method, the developing agent and the development method of the chemically amplified photoresist film may be those known conventionally in forming resist patterns by use of chemically amplified photoresists. The exposure light source used in the exposure step may be any arbitrary one emitting ultraviolet rays, deep ultraviolet rays, X rays, electron beams etc.

EXAMPLES

The present invention will now be described more specifically by reference to Examples which, however, are not to be construed to limit the present invention in any way. Additionally, in the following examples, "part(s)" means "part(s) by weight" unless otherwise specified.

Preparation of Treating Agent 1

3.5 parts of perfluorooctanesulfonic acid, 0.4 part of aminoethanol, 0.5 part of perfluoroalkyl sulfonamide and 1 part of polyvinyl pyrrolidone were uniformly dissolved in 94.6 parts of pure water at room temperature and filtered through a 0.1 μm filter to give Treating Agent 1. The pH value of this treating agent was about 2.5.

Preparation of Treating Agent 2

3.5 parts of perfluorooctanesulfonic acid, 0.3 part of aminoethanol, 0.5 part of perfluoroalkyl sulfonamide and 1 part of polyvinyl pyrrolidone were uniformly dissolved in 94.7 parts of pure water at room temperature and filtered through a 0.1 μm filter to give Treating Agent 2. The pH value of this treating agent was about 2.3.

Preparation of Treating Agent 3

3.5 parts of perfluorooctanesulfonic acid, 0.2 part of aminoethanol, 0.5 part of perfluoroalkyl sulfonamide and 1 part of polyvinyl pyrrolidone were uniformly dissolved in 94.8 parts of pure water at room temperature and filtered through a 0.1 μm filter to give Treating Agent 3. The pH value of this treating agent was about 2.1.

Preparation of Treating Agent 4

3.5 parts of perfluorooctanesulfonic acid, 0.18 part of aminoethanol, 0.5 part of perfluoroalkyl sulfonamide and 1 part of polyvinyl pyrrolidone were uniformly dissolved in 94.82 parts of pure water at room temperature and filtered through a 0.1 μm filter to give Treating Agent 4. The pH value of this treating agent was about 1.9.

Preparation of Treating Agent 5

3.5 parts of perfluorooctanesulfonic acid, 0.1 part of aminoethanol, 0.5 part of perfluoroalkyl sulfonamide and 1 part of polyvinyl pyrrolidone were uniformly dissolved in 94.9 parts of pure water at room temperature and filtered through a 0.1 μm filter to give Treating Agent 5. The pH value of this treating agent was about 1.7.

Preparation of Treating Agent 6

3.5 parts of perfluorooctanesulfonic acid, 0.5 part of perfluoroalkyl sulfonamide and 1 part of polyvinyl pyrrolidone were uniformly dissolved in 95 parts of pure water at room temperature and filtered through a 0.1 μm filter to give Treating Agent 6. The pH value of this treating agent was about 1.5.

Preparation of Treating Agent 7

3.5 parts of perfluorooctanesulfonic acid, 0.5 part of aminoethanol, 0.5 part of perfluoroalkyl sulfonamide and 1 part of polyvinyl pyrrolidone were uniformly dissolved in 94.5 parts of pure water at room temperature and filtered through a 0.1 μm filter to give Treating Agent 7. The pH value of this treating agent was about 6.2.

Example 1

A chemically amplified photoresist comprised an acrylic resin and suitable for exposure with an 193 nm (ArF) laser light source was applied onto a silicon wafer and heat-treated (pre-baked) at 110° C. for 90 minutes, and the film thickness was regulated to be 390 Å. Thereafter, the Treating Agent 1 was applied onto the photoresist and then heat-treated (soft-baked) at 90° C. for 60 seconds, and the film thickness was regulated to be 330 Å. Thereafter, the specimen was preliminary wetted with water, and the treating agent was removed. Then, 2.38% TMAH (tetramethyl ammonium hydroxide) developing solution was dropped on the photoresist, and the contact angle thereof was measured by a contact-angle meter CA-D model manufactured by Kyowa Kaimen Kagaku Co., Ltd. The result is shown in Table 1.

Separately, the Treating Agent 1 was applied onto a photoresist in the same manner as above, and the coating film was exposed by using an ArF stepper 193L manufactured by Ultratech Co., Ltd. through a test pattern having line width-to-space width ratios of 1:1, 1:3 and 1:5 and various line widths respectively. Then, the specimen was subjected to PEB at 130° C. for 90 seconds, and developed with 2.38% TMAH developing solution for 60 seconds. Out of the resulting patterns, a shape of pattern of 0.15 μm in line width was examined under a scanning electron microscope and evaluated under the following criteria. The result is shown in Table 1.

[Evaluation criteria]

◎: Very good pattern shape.

○: Good pattern shape.

Δ: The top of the pattern is slightly round but has a good shape of such an extent that the subsequent steps such as etching step are not adversely affected.

▲: The top of the pattern is slightly T-shaped but has a good shape of such an extent that the subsequent steps such as etching step are not adversely affected.

X: Poor pattern shape.

Examples 2–6 and Comparative Example 1

Procedures were conducted in the same manner as in Example 1 except for using Treating Agents 2–7 respectively. Results are shown in Table 1.

Comparative Example 2

Procedures were conducted in the same manner as in Example 1 except for using no treating agent. Results are shown in Table 1.

TABLE 1

| | | Contact angle of resist after treatment (degree) | Decreased angle of contact angle (degree) | Shape of Pattern |
|---|---|---|---|---|
| Example 1 | Treating Agent 1 | 11 | 68 | Δ |
| Example 2 | Treating Agent 2 | 10 | 69 | ○ |
| Example 3 | Treating Agent 3 | 9 | 70 | ◎ |
| Example 4 | Treating Agent 4 | 8 | 71 | ◎ |
| Example 5 | Treating Agent 5 | 8 | 71 | ○ |
| Example 6 | Treating Agent 6 | 8 | 71 | ▲ |
| Comparative Example 1 | Treating Agent 7 | 39 | 40 | X |
| Comparative Example 2 | No treating agent | 79 | 0 | X |

As can be seen from Table 1, the resist patterns having good shape and not influenced by the environment can be obtained by applying the treating agent of the present invention onto a chemically amplified photoresist and removing the treating agent after exposure.

ADVANTAGES OF THE INVENTION

As has been described in detail herein before, in the present invention, it is always possible to form resist patterns having good shape by reducing the influence of process environment to the chemically amplified photoresist.

The invention claimed is:

1. A method of forming resist patterns which comprises the steps of (a) applying and forming a chemically amplified photoresist film on a substrate, (b) applying a treating agent with a pH value of 1.3 to 4.5 onto said chemically amplified photoresist film, (c) baking said chemically amplified photoresist film after at least one of the steps of applying and forming said chemically amplified photoresist film and applying said treating agent, (d) selectively exposing said chemically amplified photoresist film, (e) post exposure-baking said chemically amplified photoresist film, and (f) developing said chemically amplified photoresist film, wherein the contact angle of a non-exposed portion of said chemically amplified photoresist film to a developing solution after washing with water to remove the treating agent on the photoresist and spin-drying before development is made lower by 10° to 110° than that in the case where said treating agent is not applied, wherein said treating agent comprises at least the following components (A), (B), (C), (D) and (E);

(A) perfluoroalkylsulfonic acid represented by the general formula:

$$C_mF_{2m+1}SO_3H \quad \text{(I)}$$

wherein m is an integer of 4 to 10,
(B) organic amine,
(C) water-soluble polymer,
(D) Perfluoroalkyl sulfonamide represented by the general formula:

$$C_nF_{2n+1}SO_2NH_2 \quad \text{(II)}$$

Wherein n is an integer of 1 to 8, and
(E) waters.

2. The method of forming resist patterns according to claim 1, wherein the chemically amplified photoresist is one suitable for exposure with an ArF laser light source.

3. The method of forming resist patterns according to claim 1, wherein the water-soluble polymer is selected from the group consisting of: poly(vinyl alcohol), poly(acrylic acid), poly(vinylpyrrolidone), poly(α-trifluoromethylacrylic acid), poly(vinyl methyl ether-co-maleic anhydride), poly(ethylene glycol-co-propylene glycol), poly(N-vinylpyrrolidone-co-vinylacetate), poly(N-vinyl-pyrrolidone-co-vinyl alcohol), poly(N-vinylpyrrolidone-co-acrylic acid), poly(N-vinylpyrrolidone-co-methyl acrylate), poly(N-vinylpyrrolindone-co-methacrylic acid), poly(N-vinylpyrrolidone-co-methyl methacrylate), poly(N-vinylpyrrolidone-co-maleic acid), poly(N-vinylpyrrolidone-co-dimethyl maleate), poly(N-vinylpyrrolidone-co-maleic anhydride), and poly(N-vinylpyrrolicone-co-itaconic acid), poly(N-vinyl-pyrrolidone-co-methyl itaconate), poly(N-vinylpyrrolidone-co-itaconic anhydride, and fluorinated polyether.

4. The method of forming resist patterns according to claim 1, wherein the treating agent to be applied to a positive-working chemically amplified photoresist in a ratio of the perfluoroalkylsulfonic acid represented by the general formula 1 to the organic amine is in molar ratio of 7:0 to 7:6.

5. The method of forming resist patterns according to claim 4, wherein the treating agent to be applied to a positive-working chemically amplified photoresist in a ratio of the perfluoroalkylsulfonic acid represented by the general formula 1 to the organic amine is in a molar ratio of 7:4 to 7:6.

6. The method of forming resist patterns according to claim 1, where a water-soluble organic solvent is used together with water in the treating agent.

7. The method of forming resist patterns according to claim 6, wherein the water-soluble organic solvent is soluable in water in a concentration of 0.1 wt % or more.

8. The method of forming resist patterns according to claim 1, wherein said treating agent has a ratio of perfluoroalkyl sulfonic acid (A)/organic amine (B)/perfluoroalkyl sulfonamide (D) of (2.0 to 7.0)/(0.1 to 1.0)/(0.01 to 2.0) where the water-soluble polymer (C) is 1.

* * * * *